United States Patent
Nishioka

(10) Patent No.: US 6,491,226 B1
(45) Date of Patent: Dec. 10, 2002

(54) METHOD AND APPARATUS FOR PREVENTING EXTRACTION OF CARD-SHAPED FUNCTIONAL DEVICE FOR INFORMATION PROCESSING APPARATUS, AND RECORDING MEDIUM STORING PROGRAM FOR REALIZING EXTRACTION PREVENTING OPERATION ON COMPUTER

(75) Inventor: Masafumi Nishioka, Tokyo (JP)

(73) Assignee: NEC Infrontia Corporation, Kawasaki (JP)

( * ) Notice: Subject to any disclaimer, the term of this patent is extended or adjusted under 35 U.S.C. 154(b) by 0 days.

(21) Appl. No.: 09/377,875

(22) Filed: Aug. 20, 1999

(30) Foreign Application Priority Data

Aug. 24, 1998 (JP) .......................... 10-237526

(51) Int. Cl.⁷ .............................. G06K 13/00
(52) U.S. Cl. ................... 235/475; 235/476; 340/545.6; 340/635
(58) Field of Search .................. 235/475, 476, 235/474, 379, 381; 361/737, 753; 340/5.3, 5.31, 5.32, 545.1, 545.3, 545.6, 545.7, 550, 635, 679

(56) References Cited

U.S. PATENT DOCUMENTS

| | | | | |
|---|---|---|---|---|
| 3,956,615 A | * | 5/1976 | Anderson et al. | 235/379 |
| 5,310,998 A | * | 5/1994 | Okuno | 235/380 |
| 5,530,302 A | * | 6/1996 | Hamre et al. | 307/149 |
| 5,589,719 A | * | 12/1996 | Fiset | 361/737 |
| 6,003,008 A | * | 12/1999 | Postrel et al. | 235/381 |
| 6,016,954 A | * | 1/2000 | Abe et al. | 235/379 |

FOREIGN PATENT DOCUMENTS

| | | | |
|---|---|---|---|
| JP | 63-204386 | | 8/1988 |
| JP | 64-018894 | * | 1/1989 |
| JP | 64-064086 A | * | 3/1989 |
| JP | 04-003680 A | * | 1/1992 |
| JP | 4-205691 | | 7/1992 |
| JP | 05-233475 A | * | 9/1993 |
| JP | 7-105324 | | 4/1995 |
| JP | 7-31305 | | 7/1995 |
| JP | 9-161468 | | 6/1997 |
| JP | 10-042231 A | * | 2/1998 |

* cited by examiner

Primary Examiner—Diane I. Lee
(74) Attorney, Agent, or Firm—Young & Thompson

(57) ABSTRACT

An apparatus for preventing extraction of a card-shaped functional device from an information-processing apparatus. The apparatus prevents extraction by audibly warning an operator when a slot cover for covering a card slot of the information-processing apparatus is opened and operational power is supplied to the card-shaped functional device. The apparatus stops the warning when the slot cover is closed or the operational power is not supplied to the card-shaped functional device.

4 Claims, 10 Drawing Sheets

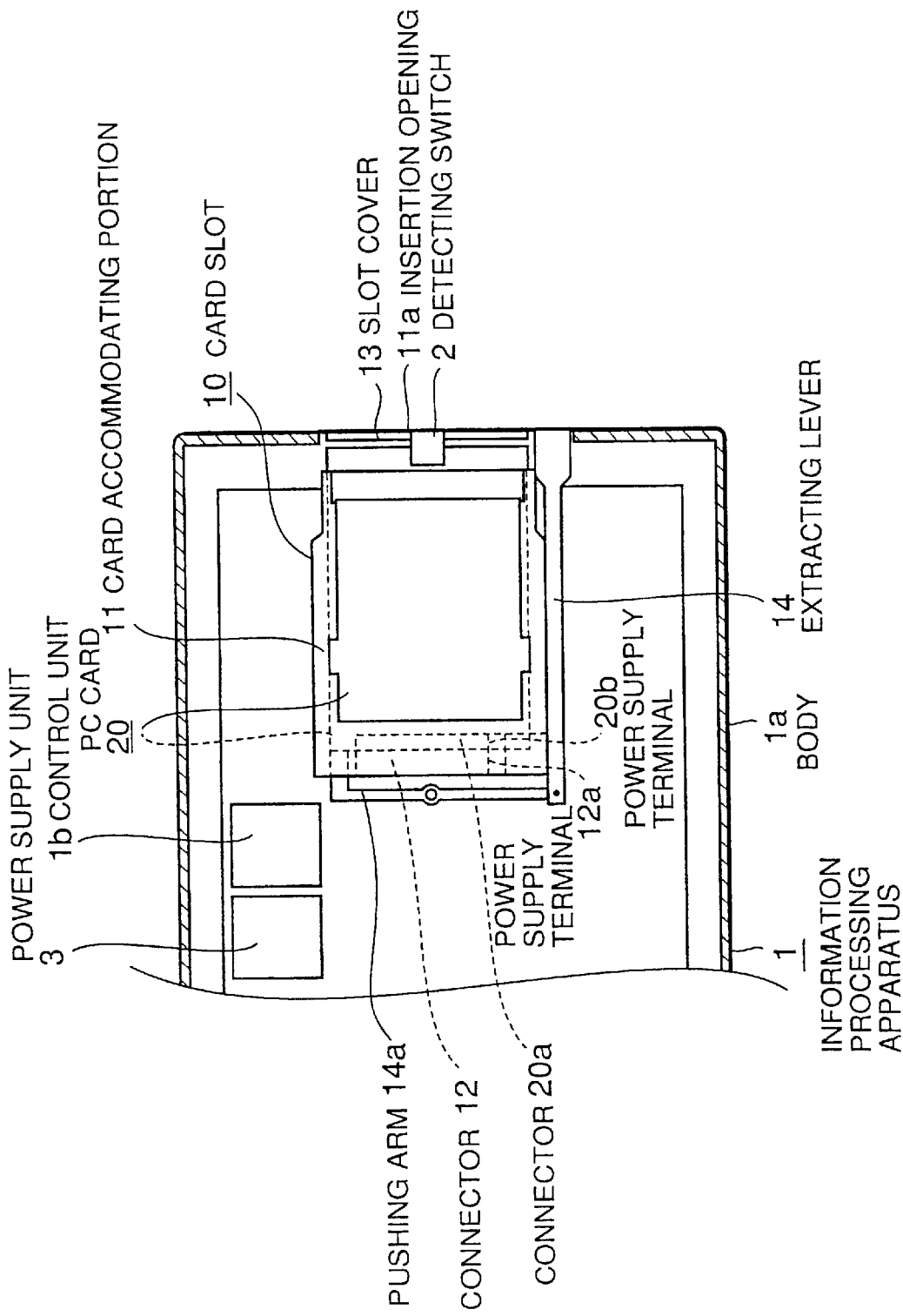

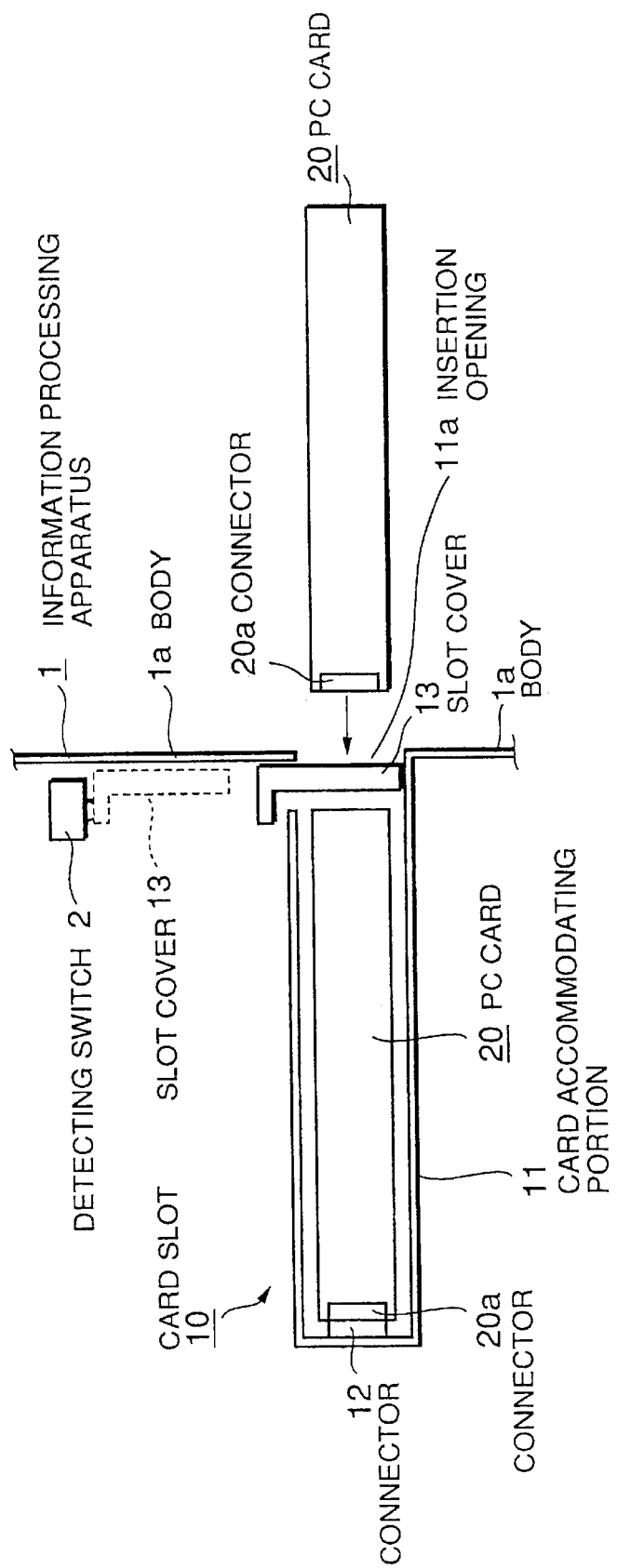

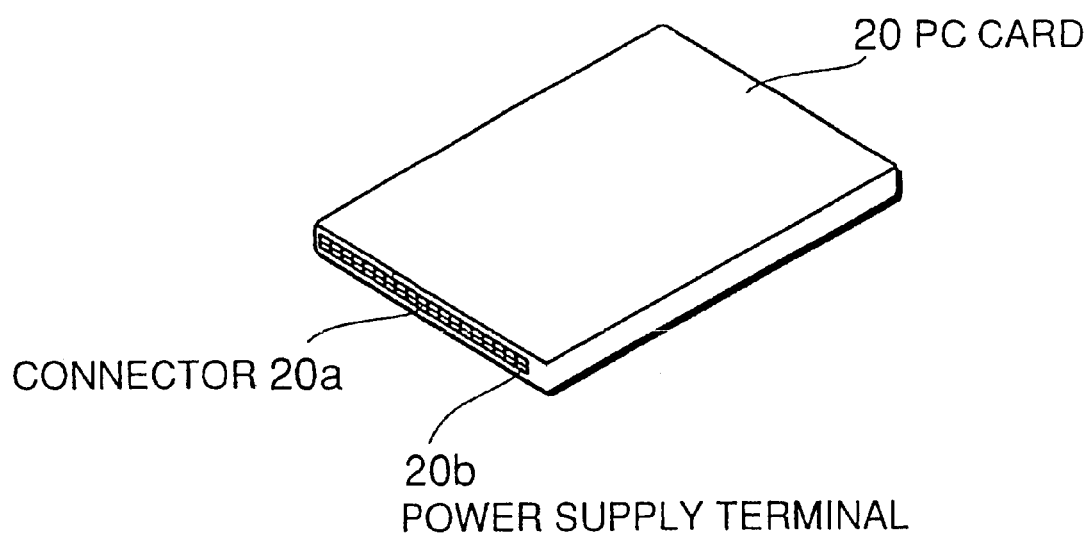

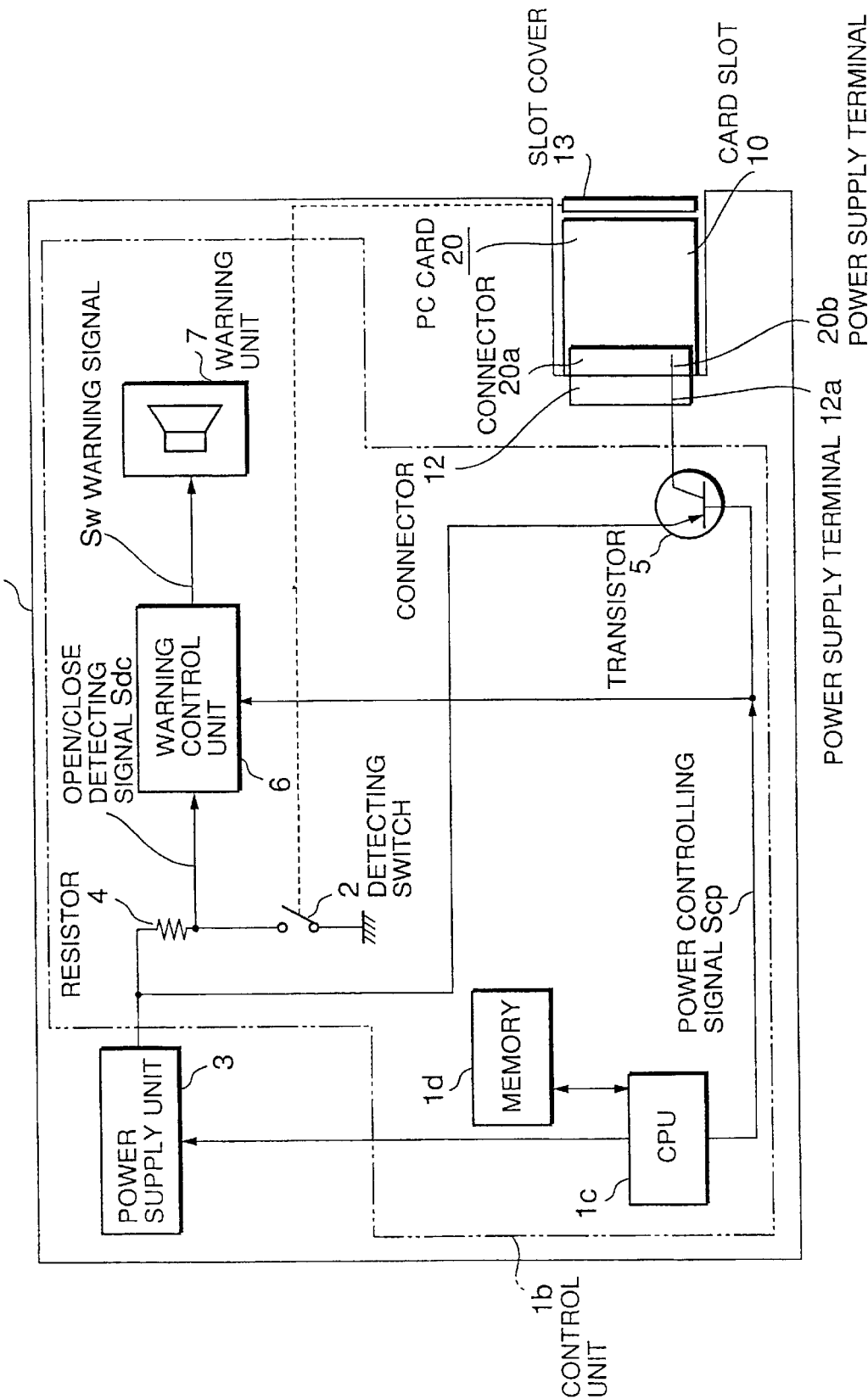

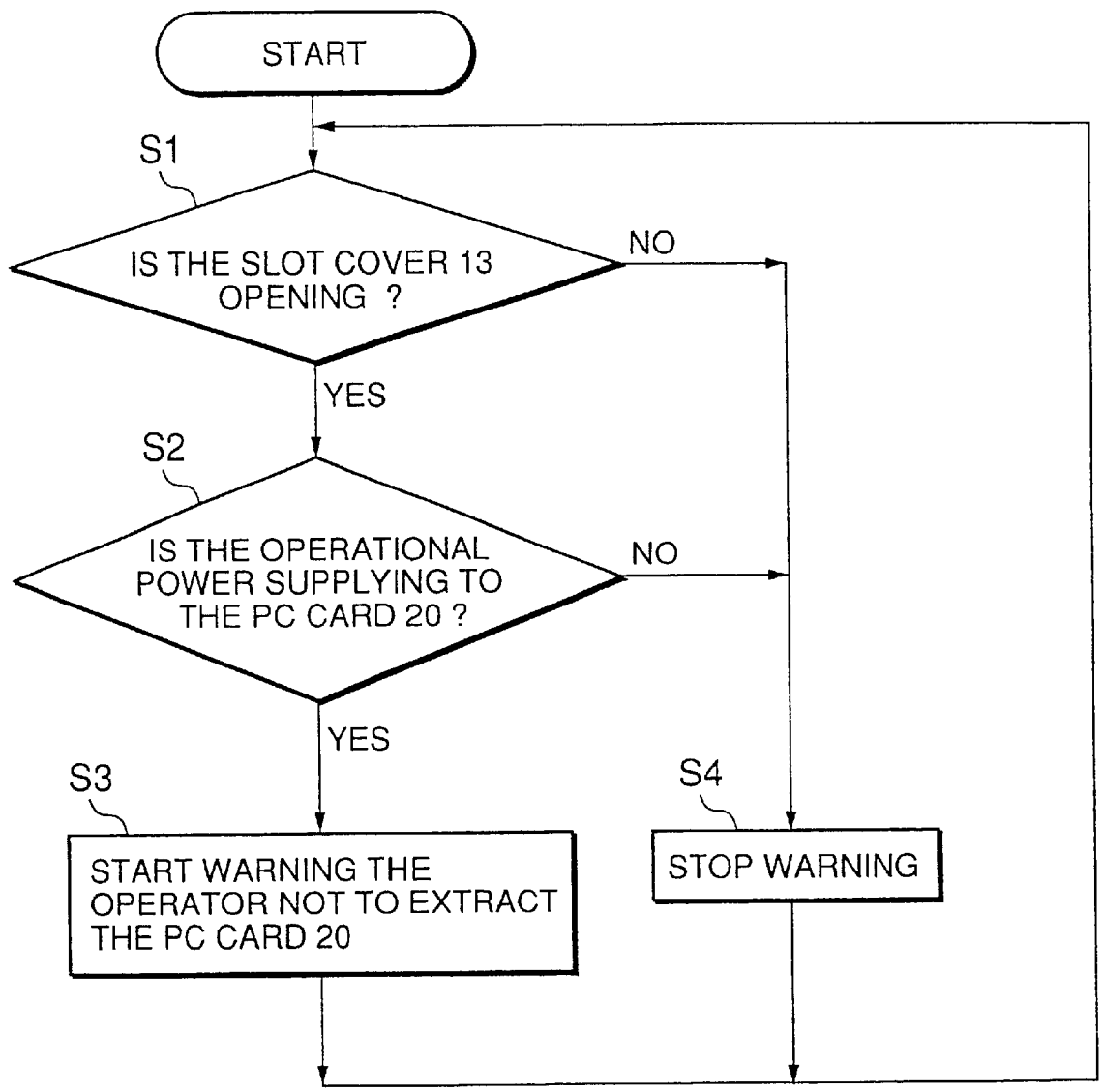

METHOD AND APPARATUS FOR PREVENTING EXTRACTION OF CARD-SHAPED FUNCTIONAL DEVICE FOR INFORMATION PROCESSING APPARATUS, AND RECORDING MEDIUM STORING PROGRAM FOR REALIZING EXTRACTION PREVENTING OPERATION ON COMPUTER

BACKGROUND OF THE INVENTION

1. Field of the Invention

The present invention relates to a method and an apparatus for preventing extraction of a card-shaped functional device for an information processing apparatus, and a recording medium storing a program for realizing extraction preventing operation on a computer.

2. Description of the Prior Art

Various types of card-shaped functional devices have been used so far; each of which includes an electronic circuit for realizing a specific function and is set to other electronic apparatus.

These types of card-shaped functional devices include (1) an IC card serving as a card-shaped device mounting an IC (Integrated Circuit) (e.g. so-called an ISO-size IC card specified in ISO (International Standards Organization) 7816 standard or an IC card having a thickness of 1/10 inch mainly used in Japan), (2) a PC card or memory card conforming to PCMCIA standard, (3) a smaller memory card, etc.

Because these card-shaped functional devices are spread, various types of information processing apparatuses are provided with card slots for mounting these card-shaped functional devices. These apparatuses include tower-type, desk-top-type, portable-type, lap-top-type, notebook-type, hand-held-type, and palm-top-type computers, a PDA (Personal Digital Assistant: a private portable information terminal), and a handy terminal (a portable terminal having the minimum number of functions such as memory function and computation function).

However, there are the following cautions for use when setting these functional devices to these information processing apparatuses.

For example, when the functional devices are extracted from the card slot while the information processing apparatuses access a file stored in the functional devices for read or write of data, the functional devices are forcibly electrically disconnected from the processing apparatuses.

Thereby, rewriting process of the file in which the data in the functional devices are currently written is forcibly interrupted and the data included in the file and the control data in a FAT (File Allocation Table) region are destroyed.

Thus, when the data are destroyed, very serious problems occur that not only the data cannot be read out from the functional devices but also the functional devices are electrically destroyed.

Therefore, it is necessary to securely prevent the functional devices from being extracted from the card slot while an information processing apparatuses access the functional devices and thus, various arts have been present in order to prevent the functional devices from being extracted.

Japanese Patent Laid-Open Publication No. 161468/97 (disclosed on Jun. 20, 1997 in Japan) discloses an art for controlling the power supply of a body whenever setting or removing a card cover for protecting a memory card provided for the card opening of the body. This art is described below as a first conventional example.

FIG. 7 is a general perspective view of the memory-card setting/removing mechanism of the first conventional example. In FIG. 7, one side of a body 103 facing the rear end of a card 102 set to a card accommodating portion 117 of the body 103 is cut out so as to serve as a part of an opening 112 for the card 102. Moreover, a concave portion 112a through which a finger can be inserted into the cutout of the body 103 is formed. Moreover, a card cover 113 for protecting the card 102 is removably set to the card opening 112 of the body 103 to control the power supply of the body 103 synchronously with setting or removing of the card 102.

Japanese Patent Laid-Open Publication No. 105324/95 (disclosed on Apr. 21, 1995 in Japan) discloses an art for detecting a card extraction preparatory state when extracting a card and cutting off the power supply of a data processing unit in accordance with the detection result of the state. This art is described below as a second conventional example.

FIG. 8A is a perspective plan view of the information card setting apparatus of the second conventional example. In FIG. 8A, the information card setting apparatus has a card slot 280 for being inserted a card 290 and read out the data stored in the card 290 to a data processing unit. The apparatus has a card detecting switch 284 for detecting the insertion of the card 290 into a card slot 280 and control means for turning off the power supply of the data processing unit in accordance with the detection result of the card detecting switch 284.

FIG. 8B is a flow chart for the IC-card insertion/extraction interrupting processing of the information card setting apparatus of the second conventional example. In FIG. 8B, when the card 290 is inserted into the card slot 280 and the card detecting switch 284 is pressed while a terminal 207 operates or when a user moves a lock lever 282 in the direction of the arrow c and thereby, a lock-lever detecting switch 283 detects that a locking state is cancelled while the terminal 207 with the card 290 is processing, runaway of the terminal 207 due to the extraction of the card 290 from a connector 299 is previously prevented by starting an IC-card insertion/extraction interrupting routine (step SP3), saving data in the RAM (step SP4), and turning off the power supply of the terminal 207 (step SP5).

Thus, in the case of the second conventional example, because the PC-card extracting operation is detected before extracting the PC card to save the data in to the RAM and then, the power supply is cut off, it is possible to avoid destruction of the file in which data is currently written since access of the terminal 207 to the PC card is not forcibly interrupted.

However, the above conventional examples have the following problems.

Firstly, the first and second conventional examples have a problem that they cannot prevent the functional device from being extracted because they have no warning function against extraction of the functional device.

Secondary, the first conventional example has a problem that the power supply of the body 103 is cut off simultaneously when the card cover 113 is removed and thereby, the data stored in the body 103 or the card 102 is destroyed.

Thirdly, the second conventional example has a problem that the processing for temporarily saving the data into the RAM and the processing for cutting off the power supply of the terminal 207 are necessary and therefore, the processing is complex.

Moreover, because the processing for saving the data into the RAM requires a certain processing time, there is a problem that it is impossible to prevent runaway of the terminal 207 or destruction of the data in the card 290 when the card 290 is extracted before the processing for saving the data is completed.

SUMMARY OF THE INVENTION

It is an object of the present invention to provide a method and an apparatus for preventing extraction of a card-shaped functional device for an information processing apparatus, capable of securely preventing the functional-device extracting operation from the information processing apparatus by an operator and a recording medium storing a program for realizing a extraction preventing operation on a computer.

To realize the above object, a method for preventing extraction of a card-shaped functional device for an information processing apparatus, has the steps of: starting warning when a slot cover for covering a card slot to which the card-shaped functional device including an electronic circuit is set so as to be opened or closed is opened and operational power is supplied to the card-shaped-functional device; and stopping the warning when the slot cover is closed or the operational power is not supplied to the card-shaped functional device.

An apparatus for preventing extraction of a card-shaped functional device for an information processing apparatus, having: a card slot to which the card-shaped functional device including an electronic circuit is set; a slot cover for covering the card slot so as to be opened or closed; a detecting unit for detecting the open/close state of the slot cover; a power supply unit for supplying operational power to the card-shaped functional device; a control unit for issuing a warning output in accordance with the combination of the detection result of the detecting unit and the supply or non-supply of the operational power from the power supply unit to the card-shaped functional device; and a warning unit for warning by receiving the warning output from the control unit.

A recording medium storing a program for realizing extraction preventing operation on a computer, the operation having the steps of: starting warning when a slot cover for covering a card slot to which the card-shaped functional device including an electronic circuit is set so as to be opened or closed is opened and operational power is supplied to the card-shaped functional device; and stopping the warning when the slot cover is closed or the operational power is not supplied to the card-shaped-functional device.

Thus, in the present invention, the warning is issued to an operator for the extracting operation of the functional device in accordance with the open/close state of the slot cover for covering the functional device and the power supply state to the functional device. Therefore, it is possible to prevent the operator from extracting the functional device while the information processing apparatus accesses the functional device.

BRIEF DESCRIPTION OF THE DRAWINGS

FIG. 1A is a perspective plan view of the apparatus of the first embodiment of the present invention for preventing extraction of a card-shaped functional device 20 for an information processing apparatus 1.

FIG. 1B is a front perspective view of the apparatus according to the FIG. 1A embodiment.

FIG. 2 is a general perspective view of a PC card 20 according to the FIG. 1A embodiment.

FIG. 3 is a circuit block diagram according to the FIG. 1A embodiment.

FIG. 4 is a processing flow chart of an extraction preventing method to be applied to the FIG. 1A embodiment.

Figure 5:
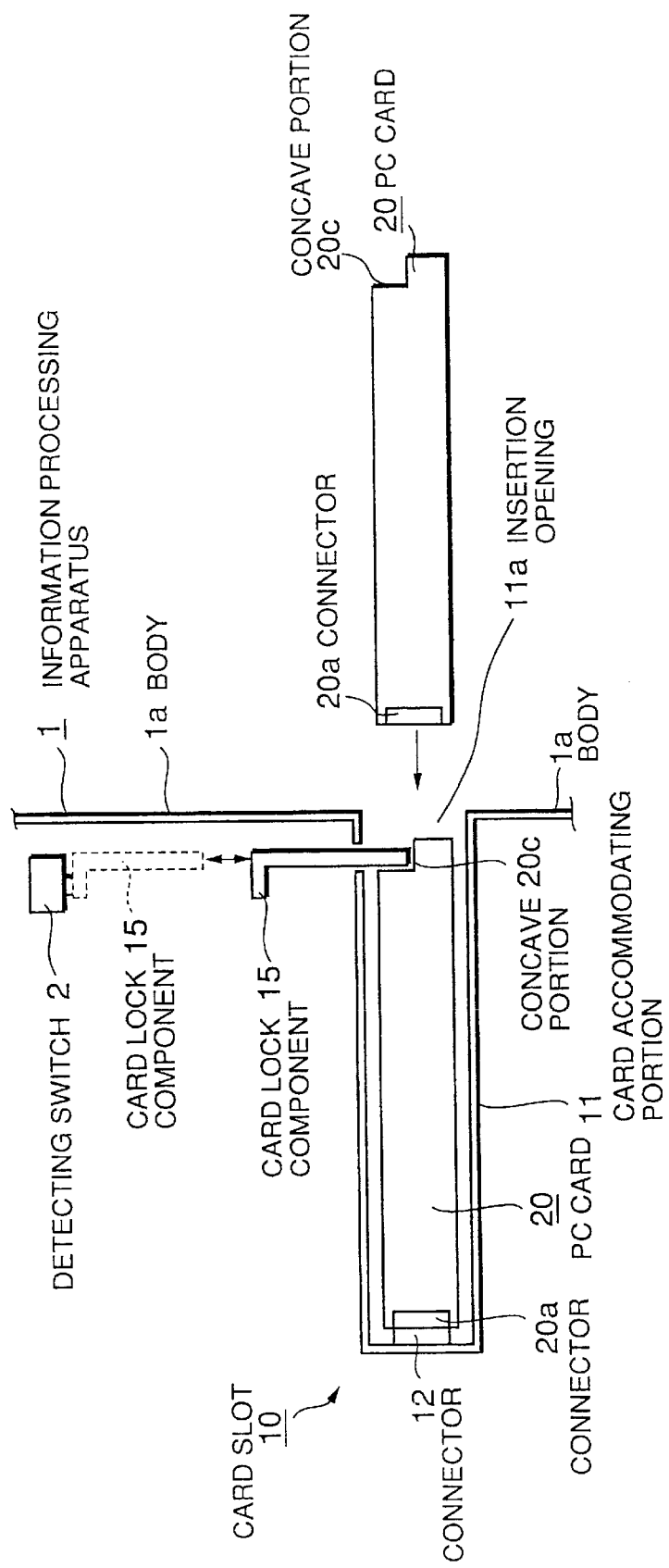
FIG. 5 is a front perspective view of the apparatus of the second embodiment of the present invention for preventing extraction of the card-shaped functional device 20 for the information processing apparatus 1.

DETAILED DESCRIPTION OF THE PREFERRED EMBODIMENTS (First Embodiment)

FIG. 1A is a perspective plan view of the apparatus of the first embodiment of the present invention for preventing extraction of a card-shaped functional device 20 from an information processing apparatus 1. FIG. 1B is a front perspective view of the apparatus according to the FIG. 1A embodiment.

In FIGS. 1A and 1B, the information processing apparatus 1 is one kind of information processing apparatus such as a computer or handy terminal, etc. The information processing terminal 1 is constituted of a control unit 1b, a power supply unit 3, and a card slot 10.

The control unit 1b is control means constituted of a CPU (Central Processing Unit) and the like, which controls various units of the information processing apparatus 1 and controls supply of operational power from the power supply unit 3 to a PC card 20.

The power supply unit 3 is a power supply unit built in the information processing apparatus 1, which supplies various portions of the information processing apparatus 1 and the PC card 20 with the operational power.

The card slot 10 is a concave portion formed on an optional portion of a body 1a of the information processing apparatus 1, in which the PC card 20 serving as a card-shaped functional device including an electronic circuit is set.

The card slot 10 is constituted of a card accommodating portion 11, a connector 12, a slot cover 13, a detecting switch 2, an extracting lever 14, and a pushing arm 14a.

The card accommodating portion 11 is an accommodating portion for accommodating the PC card 20 in it, to which the PC card 20 is set through an insertion opening 11a formed at a part of the body 1a of the information processing apparatus 1.

The connector 12 is set to the innermost portion of the card accommodating portion 11 or other optional position, on which a power supply terminal 12a electrically connectable with the power supply terminal 20b on the connector 20a of the PC card 20 is formed.

The slot cover 13 is a cover member of the card accommodating portion 11 which can be closed or opened by moving the insertion opening 11a of the card accommodating portion 11 in the direction of the arrow in FIG. 1B. The slot cover 13 is a mechanical structural component for preventing the PC card 20 from being omitted or removed from the card accommodating portion 11.

The detecting switch 2 is detecting means connected to the slot cover 13 to detect the open/close state of the slot cover 13. The detecting switch 2 outputs an open/close-state detecting signal Sdc synchronously with opening/closing of the slot cover 13. The detecting switch 2 is not restricted to a mechanical switch. It is possible to use an optical sensor or magnetic sensor as the detecting switch 2.

The extracting lever 14 is a lever for pushing and extracting the PC card 20 set to the card accommodating portion 11. The extracting lever 14 is set to the body 1a adjacently to the card accommodating portion 11 to mechanically push the PC card 20 from the card accommodating portion 11 rightward in FIGS. 1A and 1B in accordance with the pressing operation by an operator and eject it.

The pushing arm 14a is a component connected to the left end of the extracting level 14 to push the PC card 20 from the innermost portion of the card accommodating portion 11 rightward in FIGS. 1A and 1B and eject it.

FIG. 2 is a general perspective view of the PC card 20 in the FIG. 1A embodiment.

In FIG. 2, the PC card 20 is one kind of card-shaped functional device including an electronic circuit. The connector 20a electrically connectable with the connector 12 of the card slot 10 is set to a specific portion of the PC card 20.

A specific terminal of the connector 20a is used as a power supply terminal 20b to which the operational power of the PC card 20 is supplied from the power supply unit 3 of the information processing apparatus 1.

FIG. 3 is a circuit block diagram according to the FIG. 1A embodiment.

In FIG. 3, the control unit 1b is constituted of a CPU 1c, a memory 1d, the detecting switch 2, a resistor 4, a transistor 5, a warning control unit 6, and a warning unit 7.

The CPU 1c is control means built in the information processing apparatus 1, which controls the whole of the information processing apparatus 1 and moreover controls the supply of the operational power to the PC card 20. The CPU 1c stops the supply of the operational power to the PC card 20 when the information processing apparatus 1 is set to, for example, a power saving mode.

The memory 1d is storage means including a warning control program of the CPU 1c, which is connected with the CPU 1c. The memory 1d can use an electrical storage element such as a ROM, RAM, or flash memory. Moreover, instead, it is possible to read the warning control program from information storage means such as a hard disk, CD-ROM, or DVD-RAM by using information read means a hard disk drive, CD-ROM drive, or DVD-RAM drive. Furthermore, it is possible to use information read means originally provided for the information processing apparatus 1 as the above information read means.

The detecting switch 2 is detecting means to be opened or closed synchronously with the slot cover 13, which outputs an open/close detecting signal Sdc at a voltage level corresponding to the open/close state of the slot cover 13. In this case, when the slot cover 13 is present at the position shown by the broken line in FIG. 1B and opened, the detecting switch 2 is also open and thereby, the open/close detecting signal Sdc is set to high-level. However, when the slot cover 13 is present at the position shown by the continuous line in FIG. 1B and closed, the detecting switch 2 is also closed and the open/close detecting signal Sdc is set to low-level.

The output of the power supply unit 3 is connected to one end of the detecting switch 2 and the input of the warning control unit 6 through the resistor 4 and moreover, connected to the emitter of the transistor 5.

The transistor 5 is a switching device for controlling the supply of the operational power to the power supply terminal 20b of the PC card 20 from the power supply unit 3 in accordance with the level of the power controlling signal Scp output from the CPU 1c. In this case, when the power controlling signal Scp is low-level, the emitter and the collector of the transistor 5 are electrically connected each other and the operational power is supplied to the power supply terminal 20b of the PC card 20 from the power supply unit 3. However, when the power controlling signal Scp is high-level, the emitter and the collector of the transistor 5 are cut off and the supply of the operational power to the power supply terminal 20b of the PC card 20 from the power supply unit 3 is stopped.

The warning control unit 6 is exclusive control means constituted by combining a CPU and a control program of the CPU. The warning control unit 6 controls the output of a warning signal Sw in accordance with the combination of the voltage level of the open/close detecting signal Sdc and that of the power controlling signal Scp. The warning control unit 6 can be also constituted integrally with the CPU 1c.

The warning unit 7 is sound emission means for emitting warning sound in accordance with the warning signal Sw supplied from the warning control unit 6. The warning unit 7 can use optional sound emission means such as a warning buzzer for emitting the warning sound as a single unit or combination of oscillation means and a loudspeaker.

FIG. 4 is a processing flow chart of an extraction preventing method to be applied to the FIG. 1A embodiment.

The flow chart is described below by referring to FIG. 3. The warning control unit 6 decides the open/close state of the slot cover 13 in accordance with the voltage level of the open/close detecting signal Sdc.

In this case, when the slot cover 13 closes, the detecting switch 2 also closes. Therefore, the open/close detecting signal Sdc becomes low-level (step S1). The warning control unit 6 stops the output of the warning signal Sw. Thus, the warning of the warning unit 7 is stopped (step S4). Then, the step S1 is restarted.

However, when the slot cover 13 opens, the detecting switch 2 also opens. Therefore, The open/close detecting signal Sdc becomes high-level (step S1) and step S2 is started.

Then, the warning control unit 6 detects whether the operational power is supplied to the power supply terminal 20b of the PC card 20 from the power supply unit 3 in accordance with the voltage level of the power controlling signal Scp (step S2).

In this case, when the power controlling signal Scp is low-level, the warning control unit 6 decides that the operational power is currently supplied to the power supply terminal 20b from the power supply unit 3 because the emitter and the collector of the transistor 5 are electrically connected each other and warns the operator not to extract the PC card 20 from the card slot 10 by outputting the warning signal Sw and starting the operation of the warning unit 7 (step S3). Then, the step S1 is restarted.

However, when the power controlling signal Scp is high-level, the warning control unit 6 decides that no operational power is currently supplied to the power supply terminal 20b from the power supply unit 3 because the emitter and the collector of the transistor 5 are disconnected from each other and stops the warning signal Sw and the operation of the warning unit 7 (step S3). Then, the step S1 is restarted.

As described above, this embodiment makes it possible to inform the operator that the PC card 20 must not be extracted because the information processing apparatus 1 currently accesses the PC card 20 by previously detecting the operation of the operator to extract the PC card 20 in accordance with the open/close state of the slot cover 13 of the card slot 10 and starting the operation of the warning unit 7 when the operational power is currently supplied to the PC card 20.

Therefore, it is possible to securely prevent the PC card 20 from being erroneously extracted from the card slot 10 by the operator and it is unnecessary to command for forcibly interrupting the access of the information processing apparatus 1 to the PC card 20.

As a result, a file currently writing data in the PC card 20 is not destroyed and the complex operation of interrupting the access to the PC card 20 again is unnecessary.

Moreover, after the access of the information processing apparatus 1 to the PC card 20 is completed and the supply of the operational power to the PC card 20 is stopped, the data stored in the PC card 20 is not destroyed even if the operator extracts the PC card 20. Therefore, the operation of the warning unit 7 is stopped so that the operator can freely extract the PC card 20.

(Second Embodiment)

FIG. 5 is a front perspective view of the apparatus of the second embodiment of the present invention for preventing extraction of the card-shaped functional device 20 for the information processing apparatus 1.

In this embodiment, a card lock component 15 is constituted so as to be able to engage with a concave portion 20c by omitting the slot cover 13 of the first embodiment, setting the card lock component 15 capable of locking the PC card 20 to a specific position of the card accommodating portion 11 of the card slot 10 instead of the slot cover 13, and forming a concave portion 20c capable of engaging the card lock component 15 on the PC card 20. According to the above configuration, the PC card 20 cannot be extracted until the locking state of the card lock component 15 is cancelled.

The detecting switch 2 is interlocked with the card lock component 15 instead of being interlocked with the slot cover 13. That is, when the detecting switch 2 detects that the locking state of the card lock component 15 is cancelled and the warning control unit 6 detects that the operational power is supplied to the PC card 20, the warning control unit 6 starts the operation of the warning unit 7. However, when the detecting switch 2 detects that the card lock component 15 is locked or the warning control unit 6 that the supply of the operational power to the PC card 20 is stopped, the warning control unit 6 stops the operation of the warning unit 7.

This embodiment makes it possible to detect the extracting operation of the PC card 20 in accordance with the locking state of the card lock component 15 for locking the PC card 20 instead of the slot cover 13.

(Third Embodiment)

Figure 6:
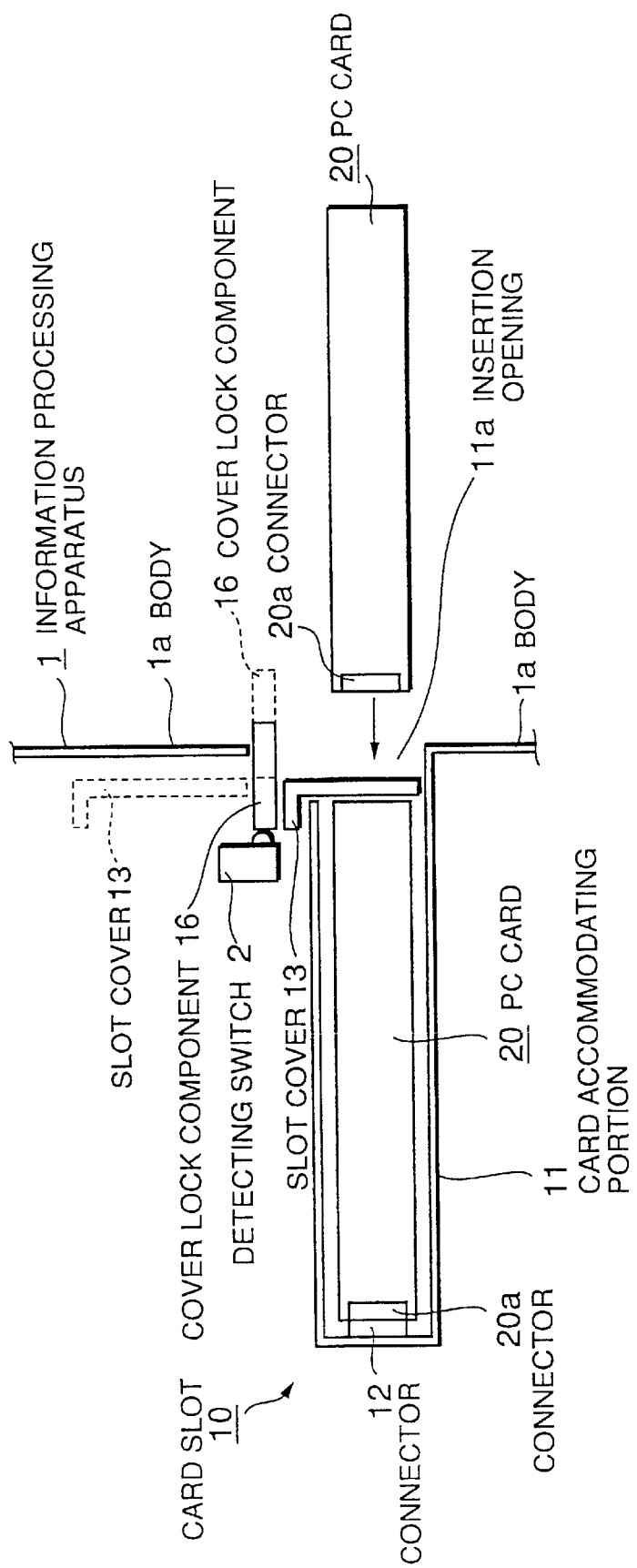
FIG. 6 is a front perspective view of the apparatus of the third embodiment of the present invention for preventing extraction of the card-shaped functional device 20 for the information processing apparatus 1.
Figure 7:
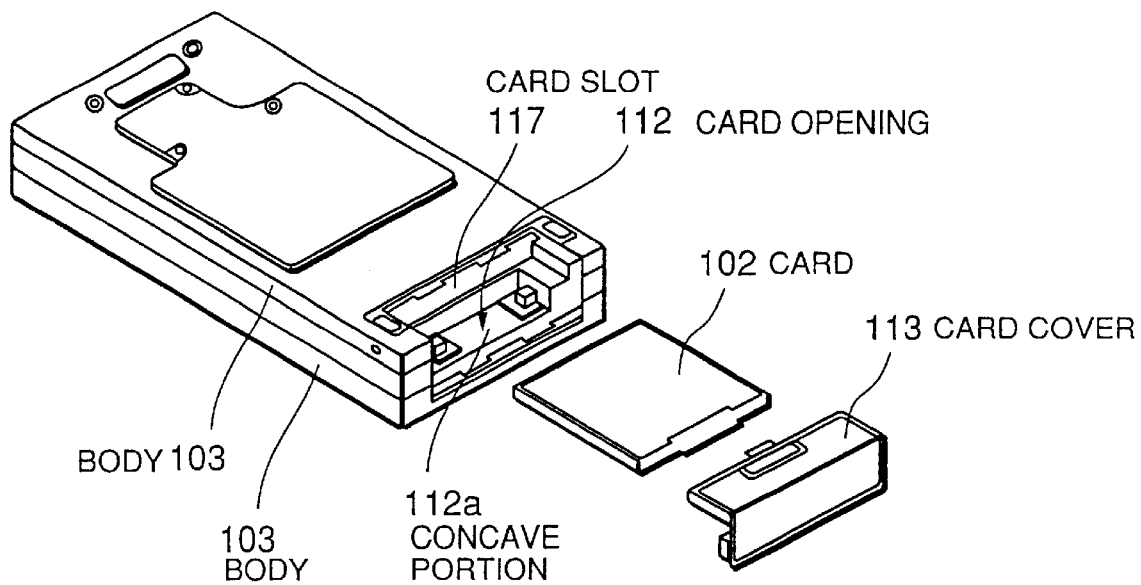
FIG. 7 is a general perspective view of the memory-card setting/removing mechanism of the first conventional example.
Figure 8A:
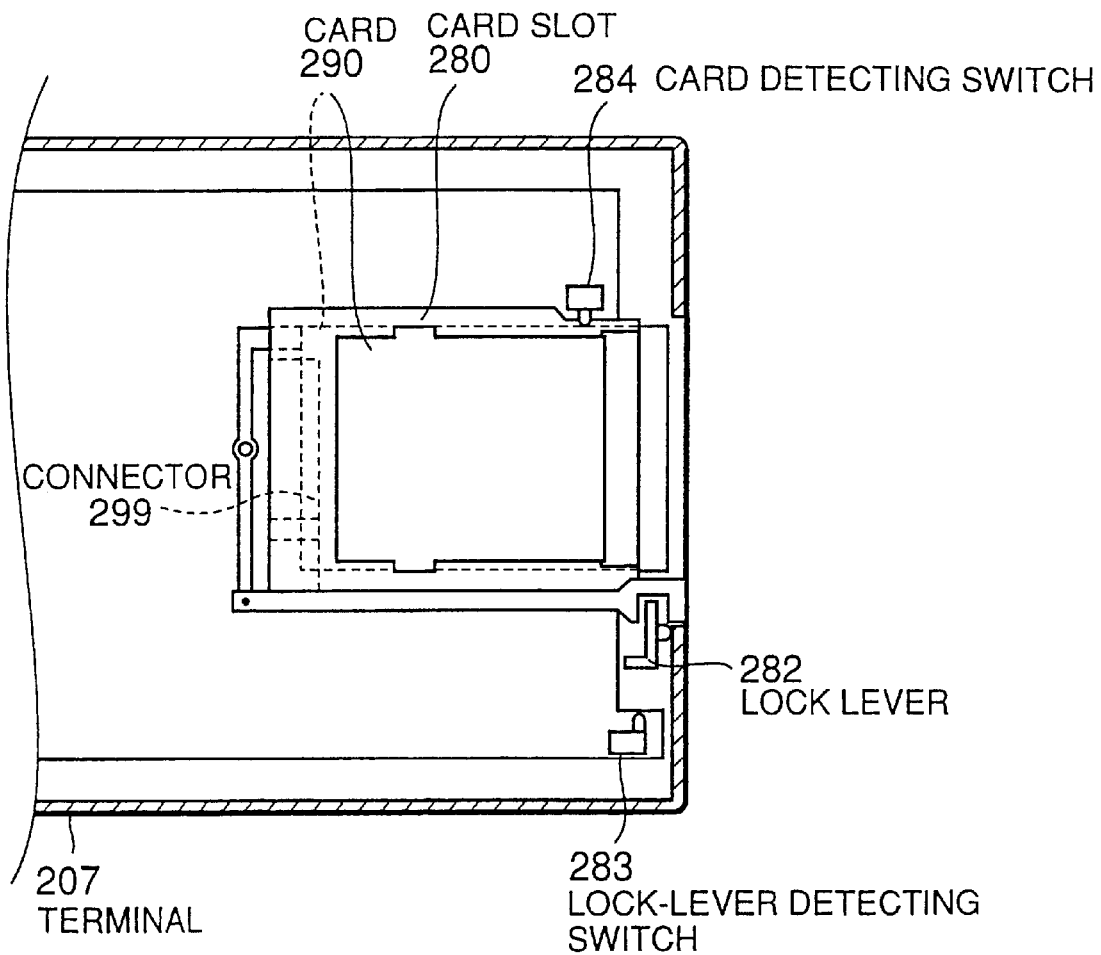
FIG. 8A is a perspective plan view of the information card setting apparatus of the second conventional example.
Figure 8B:
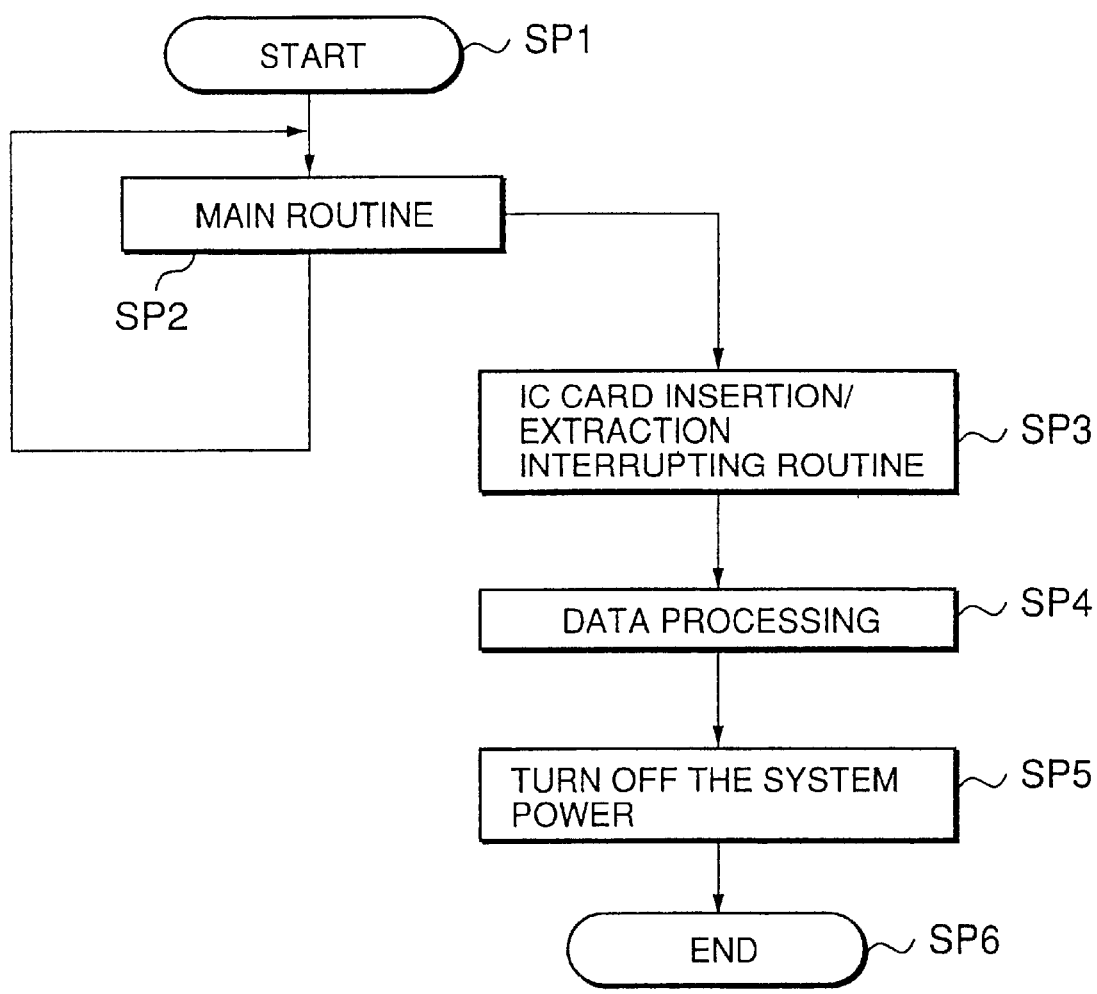
FIG. 8B is a flow chart for IC-card insertion/extraction interrupting processing of the information card setting apparatus of the second conventional example.

FIG. 6 is a front perspective view of the apparatus of the third embodiment of the present invention for preventing extraction of the card-shaped functional device 20 for the information processing apparatus 1.

In this embodiment, a cover lock component 16 capable of locking the slot cover 13 of the card accommodating portion 11 of the card slot 10 is set adjacently to the slot cover 13 in addition to the configuration of the first embodiment. According to the above configuration, the PC card 20 cannot be extracted until the locking state of the cover lock component 16 is cancelled.

The detecting switch 2 is interlocked with the cover lock component 16 instead of being interlocked with the slot cover 13. That is, the operation of the warning unit 7 is started when it is detected that the locking state of the cover lock component 16 is cancelled and the operational power is supplied to the PC card 20 but the operation of the warning unit 7 is stopped when it is detected that the cover lock component 16 is locked or the supply of the operational power to the PC card 20 is stopped.

This embodiment makes it possible to detect the extracting operation of the PC card 20 in accordance with the locking state of the cover lock component 16 for locking the slot cover 13 instead of the slot cover 13.

In the above embodiments, the open/close state of the slot cover 13 is made to coincide with the open/close state of the detecting switch 2. However, it is also possible to reverse the operation.

It is also possible to reverse the relation between the voltage level of the power controlling signal Scp and the presence or absence of the supply of the operational power to the PC card 20.

Though the state of the power supply of the operational power to the PC card 20 is detected in accordance with the presence or the absence of the power controlling signal Scp output from the CPU 1c, it is also possible to directly detect the presence or absence of the operational power to be supplied to the PC card 20 from the power supply unit 3.

The card slot 10 is formed to have a shape and dimensions capable of accommodating the whole of the PC card 20. However, the shape and dimensions of the card slot 10 are not restricted to the above. It is also possible to form the card slot 10 so as to have a shape and dimensions capable of accommodating only a part of the PC card 20.

The sound emission means are used as the warning unit 7 and driven so as to continuously or intermittently emit sound. However, the warning unit 7 is not restricted to the sound emission means. It is possible to use any means as long as the means warns the operator. For example, it is possible to use the combination of oscillation means and a loudspeaker or any means for turning on or flickering a lamp.

Instead of using the warning unit 7, it is also possible to constitute as follows. The warning control unit 6 outputs the warning signal Sw to the CPU 1c of the information processing apparatus 1, an operation system, or an application program, displays a warning screen by using the CPU 1c of the information processing apparatus 1, the display function and the warning function of the operation system, or the display function and the warning function of the application program, or generates the warning sound with sound generation means such as a loudspeaker originally provided for the information process apparatus 1.

Instead of using the display function and the warning function of the CPU 1c, an operation system, or an application program, it is also possible to stop or interrupt the processing or the operation of the information processing apparatus 1, its operation system, or its application program.

In the case of the above embodiments, the combination of the PC card and the PC card slot is used. Moreover, the present invention can be applied to the combination of optional card-shaped functional devices and slots such as the combination of a "COMPACT FLASH" (trademark of SUN-DISK Inc.) and a slot for the "COMPACT FLASH", the combination of a "SMART MEDIA" (trademark of TOSHIBA Corp. in Japan) and a slot for the "SMART MEDIA", the combination of a "MEMORY STICK" (trademark of SONY Corp. in Japan} and a slot for the "MEMORY STICK", or the combination of a IC debit card and a slot for the IC debit card.

As described above, the present invention starts warning when the slot cover of the card slot is opened and operational power is currently supplied to the card-shaped functional device and stops the warning when the slot cover is closed or no operational power is supplied to the functional device. Therefore, advantages are obtained that it is possible to securely prevent the operator from extracting the functional device from the card slot while the information processing apparatus accesses the functional device and the processing for stopping the access from the information processing apparatus to the functional device is unnecessary.

Moreover, by using the slot cover for covering the card slot and issuing warning in accordance with the open/close state of the slot cover, an advantage is obtained that it is possible to prevent extraction of the functional device during access with a simple configuration.

Furthermore, when using the card lock component for preventing extraction of the functional device instead of the slot cover for covering the card slot, an advantage is obtained that it is possible to prevent the extracting operation of the functional device during access with a simple configuration by issuing warning in accordance with the locking state of the card lock component.

Furthermore, when using the cover lock component for locking the slot cover for covering the card slot in addition to the slot cover, an advantage is obtained that it is possible to prevent the extracting operation of the functional device during access with a simple configuration by issuing warning in accordance with the locking state of the card lock component.

What is claimed is:

1. An apparatus for preventing extraction of a card-shaped function device from an information processing apparatus, comprising:
    a card slot into which said card-shaped functional device including an electronic circuit is set;
    a slot cover for covering said card slot so as to be opened or closed;
    a detecting unit for detecting said open/closed state of said card slot;
    a power supply unit for supplying operational power to said card-shaped functional device;
    a control unit for issuing a warning output in accordance with the combination of said detection result of said detecting unit and the supply or non-supply of said operational power from said power supply unit to said card-shaped functional device; and
    a warning unit for warning by receiving said warning output from said control unit, wherein
    said control unit stops outputting said warning output when said operational power is not supplied from said power supply unit to said card-shaped functional device.

2. The apparatus for preventing extraction of the card-shaped functional device from the information processing apparatus as defined in claim 1, wherein said warning unit further comprises a warning buzzer to be operated in accordance with said warning output.

3. The apparatus for preventing extraction of the card-shaped functional device from the information processing apparatus as defined in claim 1, wherein said warning unit, further comprising:
    oscillation means to be oscillated in accordance with said warning output to output a warning signal, and
    a loudspeaker for emitting sound when said warning signal is supplied.

4. An apparatus for preventing extraction of a card-shaped function device from an information processing apparatus, comprising:
    a card slot into which said card-shaped functional device including an electronic circuit is set;
    a card lock component for locking said card-shaped functional device to said card slot;
    a detecting unit for detecting one of a locking or unlocking state of said card lock component;
    a power supply unit for supplying operational power to said card-shaped functional device;
    a control unit for issuing a warning output in accordance with the combination of said detection result of said detecting unit and the supply or non-supply of said operational power from said power supply unit to said card-shaped functional device; and
    a warning unit for warning by receiving said warning output from said control unit, wherein
    said control unit stops outputting said warning output when said operational power is not supplied from said power supply unit to said card-shaped functional device.

* * * * *